US011233157B2

(12) United States Patent
Arthur et al.

(10) Patent No.: US 11,233,157 B2
(45) Date of Patent: Jan. 25, 2022

(54) SYSTEMS AND METHODS FOR UNIPOLAR CHARGE BALANCED SEMICONDUCTOR POWER DEVICES

(71) Applicant: General Electric Company, Schenectady, NY (US)

(72) Inventors: Stephen Daley Arthur, Glenville, NY (US); Alexander Viktorovich Bolotnikov, Niskayuna, NY (US); Reza Ghandi, Niskayuna, NY (US); David Alan Lilienfeld, Niskayuna, NY (US); Peter Almern Losee, Clifton Park, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 0 days.

(21) Appl. No.: 16/147,210

(22) Filed: Sep. 28, 2018

(65) Prior Publication Data
US 2020/0105944 A1 Apr. 2, 2020

(51) Int. Cl.
*H01L 29/812* (2006.01)
*H01L 29/80* (2006.01)
*H01L 21/04* (2006.01)
*H01L 29/66* (2006.01)
*H01L 29/16* (2006.01)

(52) U.S. Cl.
CPC ...... *H01L 29/8122* (2013.01); *H01L 21/0465* (2013.01); *H01L 29/1608* (2013.01); *H01L 29/66848* (2013.01); *H01L 29/66893* (2013.01); *H01L 29/806* (2013.01)

(58) Field of Classification Search
CPC .................................................. H01L 29/8122
See application file for complete search history.

(56) References Cited

U.S. PATENT DOCUMENTS

| 6,078,090 | A | 6/2000 | Williams et al. |
| 6,274,904 | B1 | 8/2001 | Tihanyi |
| 7,064,407 | B1 | 6/2006 | Mallikarjunaswamy |
| 7,345,342 | B2 | 3/2008 | Challa et al. |
| 7,452,763 | B1 | 11/2008 | Yu |

(Continued)

FOREIGN PATENT DOCUMENTS

CN 106876482 A 6/2017

OTHER PUBLICATIONS

International Search Report; Written Opinion; PCT/US2019/052474 dated Jan. 10, 2020; 13 pages.

(Continued)

*Primary Examiner* — Abul Kalam
(74) *Attorney, Agent, or Firm* — Fletcher Yoder, P.C.

(57) ABSTRACT

A charge balance (CB) field-effect transistor (FET) device may include a CB layer defined in a first epitaxial (epi) layer having a first conductivity type. The CB layer may include a set of CB regions having a second conductivity type. The CB FET device may further include a device layer defined in a device epi layer having the first conductivity type disposed on the CB layer. The device layer may include a highly-doped region having the second conductivity type. The CB FET device may also include a CB bus region having the second conductivity type that extends between and electrically couples a CB region of the set of CB regions of the CB layer to the highly-doped region of the device layer.

22 Claims, 7 Drawing Sheets

(56) References Cited

U.S. PATENT DOCUMENTS

| | | | |
|---|---|---|---|
| 9,024,375 B2 | 5/2015 | Yilmaz et al. | |
| 9,735,237 B2 | 8/2017 | Losee et al. | |
| 10,243,039 B2* | 3/2019 | Bolotnikov | H01L 29/6606 |
| 10,600,649 B2* | 3/2020 | Bolotnikov | H01L 29/36 |
| 2002/0117715 A1 | 8/2002 | Oppermann et al. | |
| 2005/0242411 A1 | 11/2005 | Tso | |
| 2008/0099837 A1* | 5/2008 | Akiyama | H01L 29/1095 257/341 |
| 2008/0303082 A1* | 12/2008 | Zara | H01L 29/0634 257/328 |
| 2009/0280609 A1* | 11/2009 | Akiba | H01L 29/0623 438/270 |
| 2014/0264477 A1 | 9/2014 | Bhalla | |
| 2015/0333169 A1* | 11/2015 | Willmeroth | H01L 29/7802 257/329 |
| 2016/0380059 A1* | 12/2016 | Losee | H01L 29/0634 257/77 |
| 2017/0117354 A1 | 4/2017 | Chen et al. | |
| 2017/0125574 A1 | 5/2017 | Chowdhury et al. | |
| 2017/0133455 A1* | 5/2017 | Seok | H01L 23/3114 |
| 2017/0278924 A1 | 9/2017 | Bolotnikov et al. | |
| 2018/0076315 A1* | 3/2018 | Maeta | H01L 29/1095 |
| 2018/0212021 A1* | 7/2018 | Roig-Guitart | H01L 29/1066 |
| 2019/0006529 A1* | 1/2019 | Bolotnikov | H01L 29/6603 |
| 2019/0067416 A1* | 2/2019 | Mauder | H01L 29/4236 |
| 2019/0088479 A1* | 3/2019 | Bolotnikov | H01L 29/0634 |

OTHER PUBLICATIONS

Baliga, Jayant; "Silicon Carbide Power Devices", World Scientific, 2005, pp. 1-6.

Wang, Shou Guo; "Fabrication and Characteristics of Ion-implanted 4H Silicon Carbide Metal-Semiconductor Field-Effect Transistors on a P-Type Epilayer", Chinese Journal of Physics, vol. 51, Issue: 2, Apr. 2013.

Kimoto, Tsunenobu, et al.; "Fundamentals of Silicon Carbide Technology Growth, Characterization, Devices, and Applications", IEEE, 2014, pp. 1-2.

Williams, Richard K., et al.; "The Trench Power MOSFET: Part 1—History, Technology, and Prospects", IEEE Transactions on Electron Devices, vol. 64, Issue: 3, pp. 674-691, Mar. 2017.

* cited by examiner

SYSTEMS AND METHODS FOR UNIPOLAR CHARGE BALANCED SEMICONDUCTOR POWER DEVICES

BACKGROUND

The subject matter disclosed herein relates to semiconductor power devices and, more specifically, to unipolar charge balanced (CB) semiconductor power devices.

For semiconductor power devices, charge balance designs offer several advantages. For example, CB FET devices demonstrate higher voltage blocking and reduced resistance relative to traditional unipolar device designs. However, the switching speed of CB FET devices using floating CB regions depends on the recombination-generation rates of the carriers in the semiconductor material. For some semiconductor materials, such as wide-bandgap materials, the recombination-generation rates may be relatively low and may result in relatively low switching speeds. To increase the recombination-generation rates and the switching speed of such CB FET devices, point defects may be introduced into the semiconductor material. However, the point defects may increase the leakage current of the device.

BRIEF DESCRIPTION

In one embodiment, a charge balanced (CB) field-effect transistor (FET) device, includes a CB layer defined within a first epitaxial (epi) layer having a first conductivity type. The CB layer includes a plurality of CB regions having a second conductivity type. Further, the CB FET device includes a device layer defined in a device epi layer having the first conductivity type disposed on the charge balance layer. The device layer includes a highly-doped region having the second conductivity type. Further, the CB FET device includes a CB bus region having the second conductivity type that extends between and electrically couples a CB region of the plurality of charge balance regions of the CB layer to the highly-doped region of the device layer.

In another embodiment, a method of manufacturing a CB FET device includes forming a first epi layer having a first conductivity type on an underlying layer. The underlying layer may be formed from wide-bandgap material. The method further includes implanting a first plurality of CB regions having a second conductivity type into the first epi layer to yield a CB layer. Further, the method includes forming a device epi layer having the first conductivity type on the CB layer. The method may also include forming a highly-doped region having the second conductivity type in the device epi layer to yield a device layer. The method also includes implanting a CB bus region having the second conductivity type that extends between and electrically couples a CB region of the plurality of CB regions of the CB layer to the highly-doped region of the device layer.

In another embodiment, a CB FET device includes a CB layer defined within a first epi layer having a first conductivity type and disposed on a wide-bandgap substrate layer having the first conductivity type. The CB layer includes a plurality of CB regions having a second conductivity type. The CB FET device further includes a device layer defined in a device epi layer having the first conductivity type disposed on the CB balance layer. The device layer includes a highly-doped region having the second conductivity type disposed at an upper surface of the device epi layer. A first contact is disposed directly on the highly-doped region. The device layer also includes a source region having the first conductivity type disposed at the upper surface of the device epi layer and proximate to the highly-doped region. A source contact is disposed directly above at least a portion of the source region. Further, the CB FET device includes a CB bus region having the second conductivity type that extends between and electrically couples a CB region of the plurality of charge balance regions of the CB layer to the highly-doped region of the device layer.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
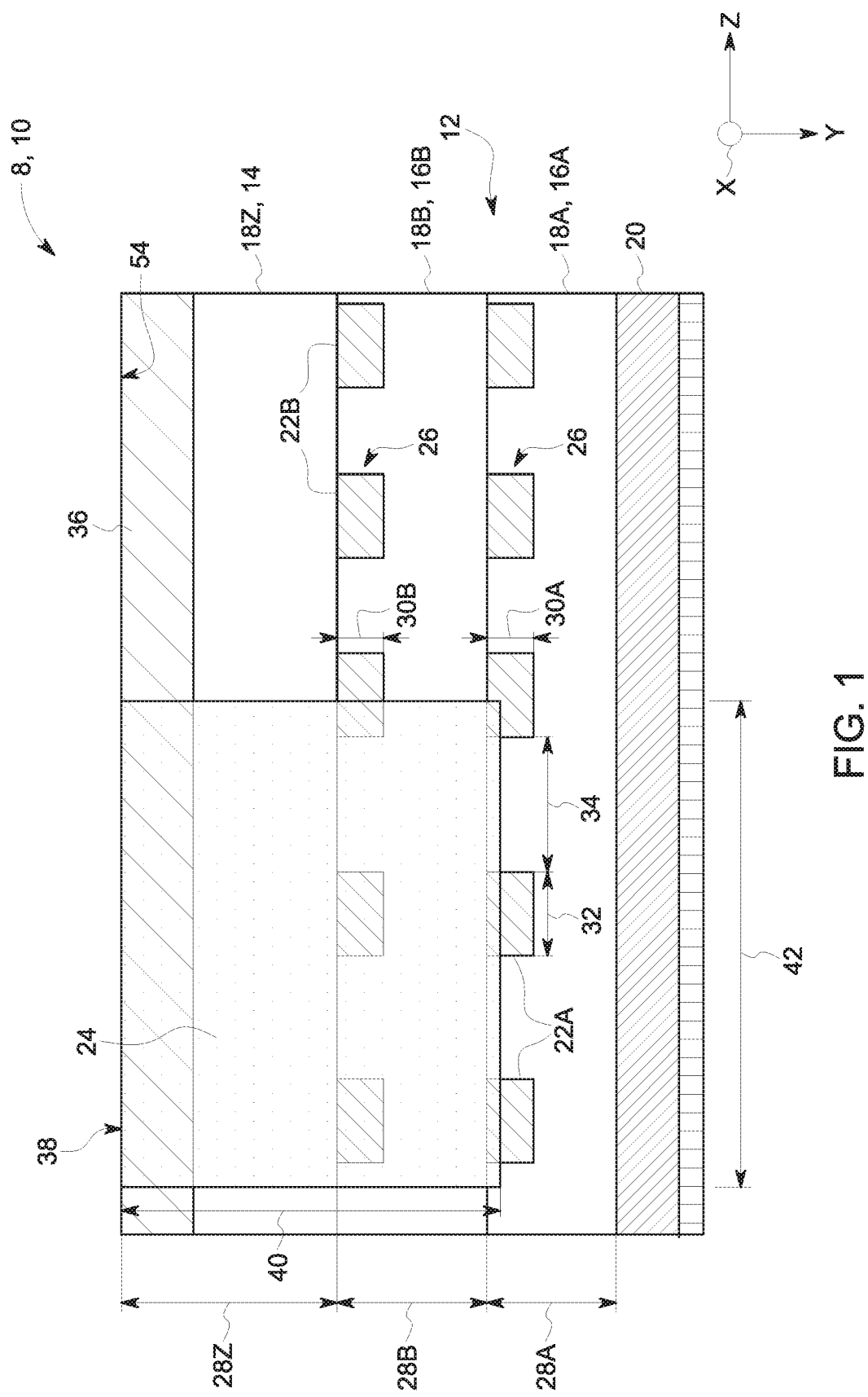
FIG. 1 is a cross-sectional view of a semiconductor device that includes a number of charge balance (CB) layers, each having a set of CB regions, where a CB bus electrically couples at least a portion of the CB regions to a region of like conductivity type in a device layer of the semiconductor device, in accordance with an embodiment.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise. Further, as used herein, the term "disposed on" refers to layers disposed directly in contact with each other or indirectly by having intervening layers there between, unless otherwise specifically indicated. Accordingly, the term "disposed directly on" as used herein means that the two layers are directly in contact with each other with no intervening layers there between. The term "adjacent" as used herein means that the two layers and/or two features (e.g., implanted regions) are disposed contiguously and are in direct contact with each other.

In the present disclosure, when a layer/region is being described as "on" another layer or substrate, it is to be understood that the layers/regions can either be directly contacting each other or have one (or more) layer or feature between the layers and regions. Further, the term "on" describes the relative position of the layers/regions to each other and does not necessarily mean "on top of" since the relative position above or below depends upon the orientation of the device to the viewer. Moreover, the use of "top," "bottom," "above," "below," "upper", and variations of these terms is made for convenience, and does not require any particular orientation of the components unless otherwise stated. With this in mind, as used herein, the terms "directly above" and "directly below" describe the relative position of layers/regions directly in contact with each other with no intervening layers there between. Further, as used herein, the terms "lower," "middle," or "bottom" refer to a feature (e.g., epitaxial layer) that is relatively nearer the substrate layer, while the terms "top" or "upper" refer to the particular feature (e.g., epitaxial layer) that is relatively distant from the substrate layer.

Present embodiments are directed toward designs and methods of manufacturing unipolar semiconductor charge-balance (CB) devices. The disclosed designs and methods are useful in the manufacture of CB field-effect transistor (FET) devices, such as vertical channel junction field-effect transistors (JFETs), horizontal channel JFETs, vertical channel metal-semiconductor field-effect transistors (MESFETs), as well as other devices that may be useful for medium-voltage (e.g., 2 kilovolt (kV)-10 kV) and high-voltage (e.g., greater than or equal to 10 kV or 10 kV-20 kV) power conversion related applications. Further, the disclosed designs and methods are useful in the manufacture of wide-bandgap CB FET devices, such as silicon carbide (SiC) devices, gallium nitride devices, diamond devices, aluminum nitride devices, boron nitride devices, as well as other CB FET devices manufactured using one or more wide-bandgap semiconductor materials.

As discussed below, the disclosed CB FET devices include multi-layered drift regions implemented using repeated epitaxial growth and dopant implantation steps. As used herein, the term "multi-layered," as well as references to a particular number of layers (e.g., "two-layered," "three-layered," "four-layered,"), refers to the number of epitaxial (epi) layers of the CB FET device. The disclosed multi-layered drift region designs include charge balance (CB) layers having a first conductivity type (e.g., n-type CB layers). Further, each of these CB layers includes a set of charge balance (CB) regions of second conductivity type, which are discrete, buried, implanted regions that reshape the electrical field in the active area of a CB FET device. These CB regions are described herein as "buried" in that they are disposed within the lower epi layers (e.g., within a CB layer that is disposed between the upper/device epi layer and the substrate layer) of the CB FET device. For the disclosed CB FET device embodiments, as discussed below, these CB layer designs enable low conduction losses and high blocking voltages while still maintaining a relatively simple fabrication process.

Further, as discussed below, the disclosed CB FET devices include a CB bus (e.g., CB bus region) of the same conductivity type as the CB regions, and the CB bus generally provides an electrical connection (e.g., a vertical connection) between one or more of the CB regions of one or more of the CB layers and a highly-doped region (e.g., a gate region or a portion of a blocking junction) of the same conductivity type (relative to the CB regions) that is disposed within the device epi layer (e.g., relatively distant from the substrate layer) of the device. As such, when the CB FET device transitions from an off-state to on-state, carriers are able to flow directly from the highly-doped region to the CB regions via the CB bus. Conversely, during a transition from on-state to off-state, carriers are able to flow directly from the CB regions to the highly-doped region via the CB bus. As a result, the switching performance of disclosed CB FET devices is independent of the recombination-generation rates of the carriers, thereby offering increased switching speeds and reduced switching and dynamic on-resistance losses. Further, the high blocking voltages produced by the CB FET devices are maintained or improved.

FIG. 1 is a cross-sectional view of an embodiment of a semiconductor device 8, such as a charge balance (CB) field-effect transistor (FET) device 10, having a drift region 12 that includes a device layer 14 disposed on a number of charge balance (CB) layers 16. It may be appreciated that, in order to more clearly illustrate certain components of the CB FET device 10, as well as other devices discussed below, certain commonly understood design elements (e.g., top metallization, passivation, edge termination, and so forth) may be omitted.

As discussed below, the drift region 12 of the CB FET device 10 includes a number of epitaxial (epi) layers 18 having a first conductivity type (e.g., n-type epi layers 18) that form the device layer 14 and the CB layers 16 of the CB FET device 10. Additionally, the epi layers 18 each have a dopant concentration, which may be the same or different, in certain embodiments. While the illustrated embodiment includes three epi layers 18 (e.g., 18A, 18B, and 18Z), the CB FET device 10 may include any suitable number of epi layers 18 (e.g., 2, 4, 5, 6, or more) to yield a CB FET device 10 having a particular desired voltage rating. In some embodiments, the epi layers 18 are generally formed from one or more wide-bandgap semiconductor materials, such as silicon carbide, gallium nitride, diamond, aluminum nitride, and/or boron nitride. The epi layers 18 may be fabricated using repeated cycles of epitaxial overgrowth. As illustrated, the first epi layer 18A is disposed above and adjacent to a substrate layer 20, the second epi layer 18B is disposed above and adjacent to the first epi layer 18A, and the third epi layer 18Z (e.g., the device epi layer) is disposed above and adjacent to the second epi layer 18B. In other embodiments, the CB FET device 10 may include additional epi layers 18 (e.g., 18C, 18D, and so forth) intervening between the first epi layer 18A and the second epi layer 18B and/or between the second epi layer 18B and the device epi layer 18Z.

To reduce on-state resistance (Rds(on)) and resultant on-state conduction losses, the CB FET device 10 includes two CB layers 16A and 16B implanted into the epi layers 18A and 18B, respectively, that each includes a respective set of CB regions 22 (e.g., 22A and 22B, respectively). Additionally, the CB FET device 10 includes a charge balance (CB) bus 24 electrically coupled to at least a portion of the CB regions 22. Within the CB layers 16, the CB regions 22 are oppositely doped relative to the remainder 26 of the epi layers 18. In other words, for CB FET devices 10 having n-type CB layers 16 (e.g., n-type SiC epitaxial layers 18), the CB regions 22 are p-type, and for CB FET devices 10 having p-type epi layers 18, the CB regions 22 are n-type. Further, the dopant concentration in the set of CB regions 22A of the CB layer 16A may be the same or different as the dopant concentration in the set of CB regions 22B of the CB layer 16B, in certain embodiments. Moreover, the CB regions 22 and the remainder 26 of the epi layers 18A and 18B are each generally designed to substantially deplete and to generally provide similar amounts (e.g., substantially equal amounts) of effective charge (e.g., per cm$^2$, normalized to device active area) from ionized dopants under reverse bias. The illustrated charge balance structure allows the CB FET device 10 to achieve high breakdown voltage and low on-state resistance, since the p-type semiconductor portions and the n-type semiconductor portions are both completely depleted under nominal blocking conditions.

As illustrated, the CB regions 22 of the CB FET device 10 are separated by (e.g., not vertically connected through) and do not extend through the entire thicknesses of the epi layers 18A and 18B. In particular, the epi layers 18A, 18B, and 18Z have thicknesses 28A, 28B, and 28Z, respectively, that may be the same or different, in certain embodiments. In some embodiments, the thicknesses 28A, 28B, and 28Z of the epi layers 18A, 18B, and 18Z, respectively, may each be between 10 µm and 12 µm. Additionally, the CB regions 22A and 22B in the CB layers 16A and 16B of the illustrated CB FET device 10 have a particular thickness 30A and 30B, respectively. It should be appreciated that, in some embodiments, the respective thicknesses 30A and 30B of the CB regions 22A and 22B may be different the same or different. As illustrated, the thickness 30B of the set of CB regions 22B in the second CB layer 16B is less than the thickness 28B of the epi layers 18B, and as such, the first set of CB regions 22A and the second set of CB regions 22B are not vertically connected through (e.g., do not extend through the entire respective thicknesses 28B) of the epi layer 18B.

Additionally, with respect to dimensions, each of the CB regions 22 may be described as having a particular width 32 and a particular spacing 34. In certain embodiments, the dimensions (e.g., thickness 30, width 32, and/or spacing 34) of the CB regions 22 may be different in different CB layers 16. In different embodiments, the CB regions 22 may have different cross-sectional shapes (e.g., defined by an implantation mask and/or implantation energies/doses). For some embodiments, the shape of the CB regions 22 may not substantially vary along the Y-axis.

Further, it should be appreciated that the doping of the epi layers 18, the doping of the CB regions 22, the thicknesses 28 of the epi layers 18, the thickness 30 of the CB regions 22, the width 32 of the CB regions 22, and the spacing 34 between the CB regions 22 may be varied for different embodiments to enable desired electrical performance (e.g., desired blocking voltage) of the CB FET device 10. For example, in some embodiments, certain device parameters (e.g., the thickness 28 and doping of the epi layers 18) may be selected to provide a blocking voltage of the CB FET device 10 that is between approximately 1 kilovolt (kV) and 10 kV, 1 kV and 5 kV, or any other suitable range.

Further, in some embodiments, the disclosed CB regions 22 and CB layers 17 may have one or more properties (e.g., doping, width 32, depth, spacing 34, etc.), as described for floating charge-balance regions in U.S. Pat. No. 9,735,237, entitled, "ACTIVE AREA DESIGNS FOR SILICON CARBIDE SUPER-JUNCTION POWER DEVICES," filed Jun. 26, 2015, the disclosure of which is hereby incorporated by reference in its entirety for all purposes. For example, in some embodiments, the thicknesses 28A and 28B of each of the epi layers 18A and 18B is between 5 µm and 20 µm. The thicknesses 30A and 30B of the CB regions 22 is in the range of 0.5 µm to 1.0 µm, the width 32 of the CB regions 22 is between 0.1 µm and 2 µm, and the spacing 34 between the CB regions 22 is between 1 µm and 6 µm. For such embodiments, the dopant concentration of the CB regions 22 may be between $2 \times 10^{16}$ per centimeters cubed (cm$^{-3}$) and $1 \times 10^{18}$ cm$^{-3}$. More specifically, in some embodiments, because the CB regions 22 may be implanted with a variable distribution of dopant concentrations, the CB regions 22 may be described as having an integrated charge (e.g., dose) of approximately (e.g., +/−20% and/or +/−50%) $2 \times 10^{13}$ per centimeters cubed (cm$^{-2}$). The integrated charge may be determined and/or adjusted based in part on the depth at which the CB regions 22 are implanted and/or the implant acceleration energy used to implant the CB regions 22. In such embodiments, the epi doping of the epi layers 18 may be greater than or equal to $5 \times 10^{15}$ cm$^{-3}$, which may yield a device having a particular on resistance (e.g., less than 7 megaohms per square centimeter (mOhm/cm$^2$) and a particular breakdown voltage (e.g., greater than 3 kV, greater than 4.5 kV). In some embodiments, the doping concentration of the set of CB regions 22A divided by the respective thickness (e.g., 30A or 30B) of the CB regions 22A may be greater than or equal to $5 \times 10^{12}$ cm$^{-2}$ and less than or equal to approximately $1 \times 10^{14}$ cm$^{-2}$ Accordingly, in such embodiments, the set of CB regions 22A and/or the set of CB regions 22B may have a doping concentration between $5 \times 10^{16}$ cm$^{-3}$ and $2 \times 10^{18}$ cm$^{-3}$. Moreover, in some embodiments, the CB FET device 10 may include fewer or additional CB layers 12 (e.g., one CB layer 16, three CB layers 16, four CB layers 16, and/or the like) to achieve a desired voltage rating, for example.

As noted above, the CB FET device 10 also includes the CB bus 24 to decrease switching losses and increase switching speed. The CB bus 24 has the same conductivity type as the CB regions 22, which is opposite the conductivity type of the remainder 26 of the epi layers 18. Accordingly, for CB FET devices 10 having n-type epi layers 18, the CB bus 24 and CB regions 22 are p-type, and for CB FET devices 10 having p-type epi layers 18, the CB bus 24 and CB regions 22 are n-type. Further, the doping concentration of the CB bus 24 may be the same or different as the set of CB regions 22A of the CB layer 16A and/or the CB regions 22B of the CB layer 16B. Moreover, as illustrated, the CB bus 24 is in contact with and electrically coupled to a highly-doped region 36 of the device layer 14 having the same conductivity type as the CB bus 24 and the CB regions 22. More specifically, the CB bus 24 is electrically coupled to the highly-doped region 36, which may be a gate region, a portion of a blocking junction, such as a highly-doped region, a shield region, and/or the like, in the device layer 14. As used herein, the term "highly-doped" refers to a doping concentration of approximately $1 \times 10^{19}$ cm$^{-3}$ or more. Further, the CB bus 24 may be implanted into one or more of the epi layers 18. In particular, the disclosed CB bus 24 may connect (e.g., electrically couple) the highly-doped region 36 disposed in the device layer 14 to at least a portion of the CB regions 22. In particular, the disclosed CB bus 24 may extend vertically (e.g., along the Y-axis) from one or more highly-doped regions 36 (e.g., from one or more features near a top surface 38 of the device layer 14) to at least a portion of the CB regions 22.

In some embodiments, the CB bus 24 may have a depth 40 (e.g., vertical dimension along the Y-axis, thickness) to reach the deepest CB regions 22 (e.g., the CB regions 22 that are nearest the substrate layer 20 and farthest from the device layer 14). Further, the depth 40 of the CB bus 24 may be such that the CB bus 24 extends to and contacts (e.g., are disposed adjacent to) the deepest CB regions 22, extend through (e.g., overlap with) a portion of the thicknesses 30 of the deepest CB regions 22, or extend through (e.g., overlap with) the entire thicknesses 30 of the deepest CB regions 22.

In particular, in the illustrated embodiment, the CB bus 24 extends from (e.g., is disposed adjacent to and contacts) the highly-doped region 36 through the device epi layer 18Z (e.g., through the thickness 28Z of the device epi layer 18Z), through the second epi layer 18B (e.g., through the thickness 28B of the second epi layer 18B), and through a portion of the thickness 28A of the first epi layer 18A (e.g., through a portion of the thickness 30A of the set of CB regions 22A in the first CB layer 16A). Accordingly, the CB bus 24 may electrically couple the highly-doped region 36 to one or more CB regions 22 in one or more respective CB layers 16 (e.g., separated vertically across the Y-axis). Moreover, the CB bus 24 may electrically couple CB regions 22 within the same CB layer 16 (e.g., separated horizontally across the Z-axis) and/or in different CB layers 16 (e.g., separated vertically across the Y-axis) to one another. However, it should be appreciated that, in other embodiments, the depth 40 may be such that the CB bus 24 only extends through the thickness 28Z of the device epi layer 18Z and at least a portion of the thickness 28B of the epi layer 18B (e.g., the CB bus 24 does not contact the set of CB regions 22A in the bottom CB layer 16A), or such that the CB bus 24 extends through the entire thickness 30A of the set of CB regions 22A in the bottom CB layer 16A.

The CB bus 24 also includes a width 42. As illustrated, a subset of the CB regions 22 are defined (e.g., along the Z-axis) within the width 42 of the CB bus 24. However, it should be appreciated that, in other embodiments, the additional or fewer CB regions 22 may be disposed within or partially contact (e.g., only partially disposed within) the CB bus 24. Moreover, the CB bus 24 may be disposed in any suitable location along the Z-axis. Further, the depth 40, width 42, and the dopant concentration of the CB bus 24 may be selected to maintain charge balance within the CB layers 16 (e.g., the lower epi layers 18A and 18B) having the CB regions 22, as well as to enable desirable electrical performance of the CB FET device 10 (e.g., a desired blocking voltage).

While the illustrated embodiment includes a single CB bus 24, in other embodiments, the CB FET device 10 may include one or more additional CB buses 24 along the Z-axis and/or the X-axis. That is, for example, the CB FET device 10 may include any suitable number of CB buses 24 in the form of continuous, vertical pillars or continuous, vertical blocks) that are each implanted into one or more portions of the epi layers 18A-Z. It should be noted that in such embodiments, each additional CB bus 24 has the same conductivity type as the illustrated CB bus 24 and contacts the same or a different highly-doped region 36. Accordingly, in some embodiments, at least one CB bus 24 may extend through at least a portion of the thickness 28 of the epi layers 18 to contact and electrically couple each of the CB regions 22 to at least one highly-doped region 36. Moreover, the dimensions (e.g., width 42, depth 40) of each of the CB buses 24 may be the same or different from one another, in different embodiments.

Figure 2:
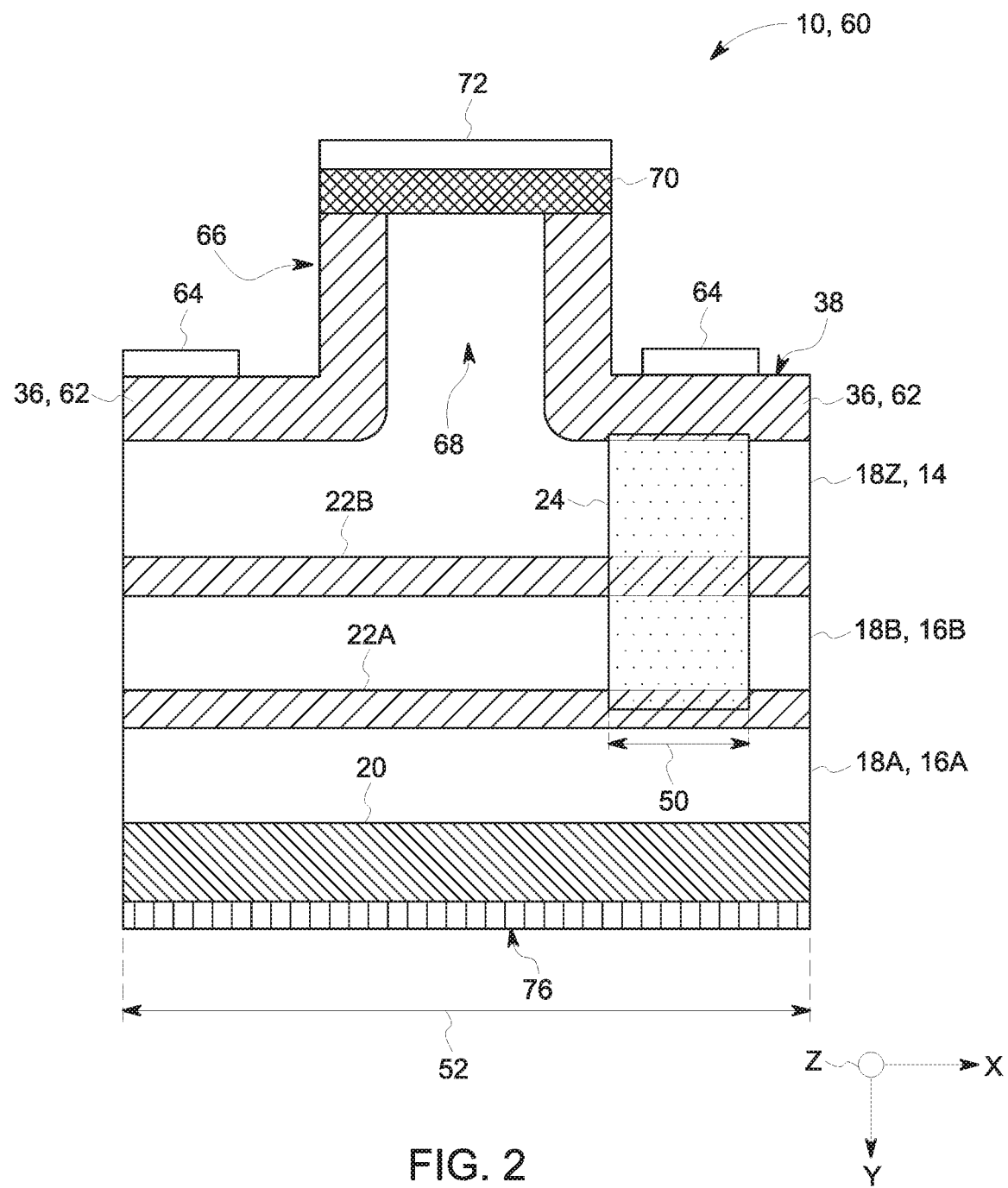
FIG. 2 is a cross-sectional view of a vertical channel junction field-effect transistor (JFET) device that includes the CB bus, in accordance with an embodiment.
Figure 3A:
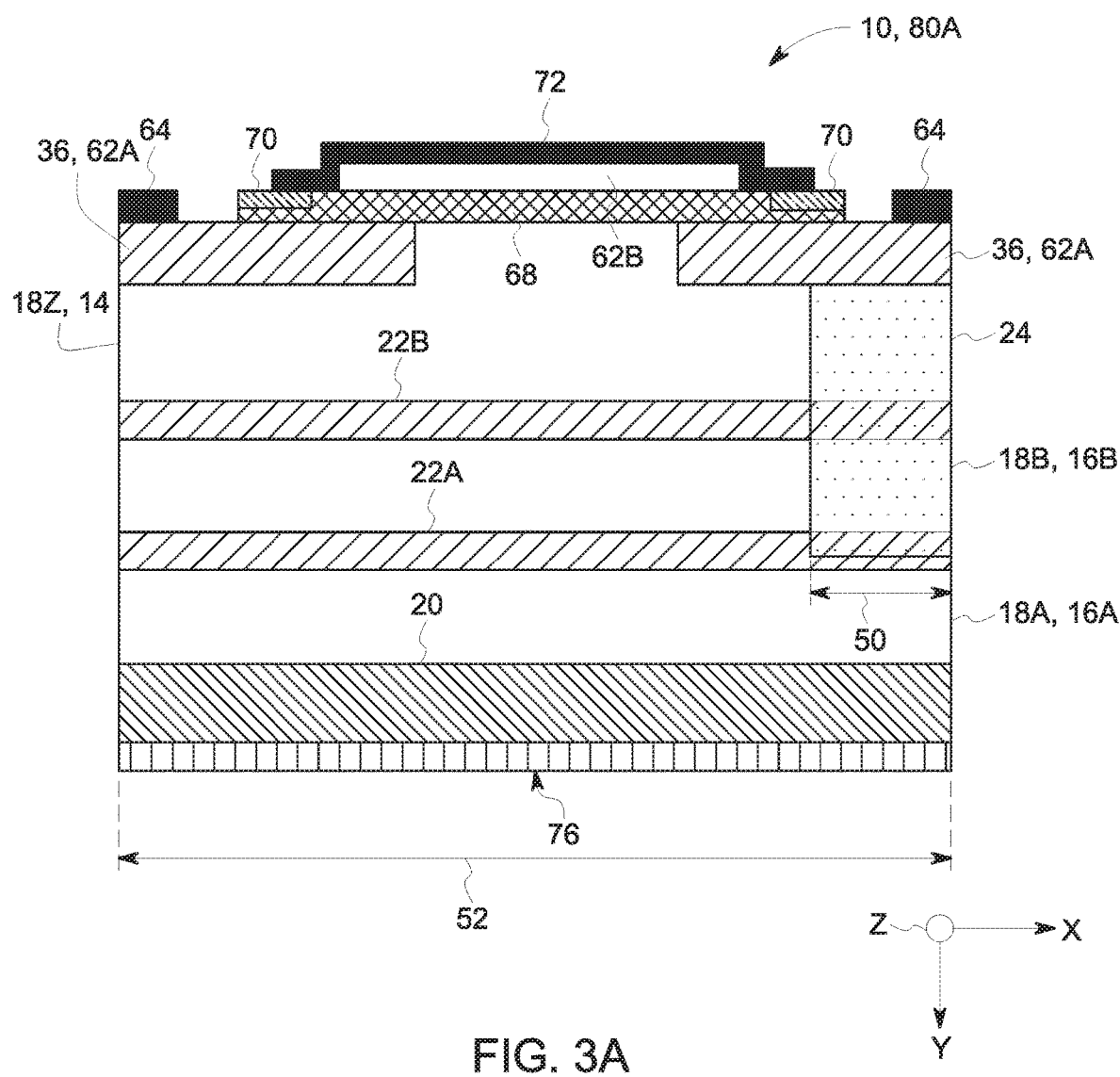
FIG. 3A is a cross-sectional view of a first embodiment of a horizontal channel JFET device that includes the CB bus, in accordance with an embodiment.
Figure 3B:
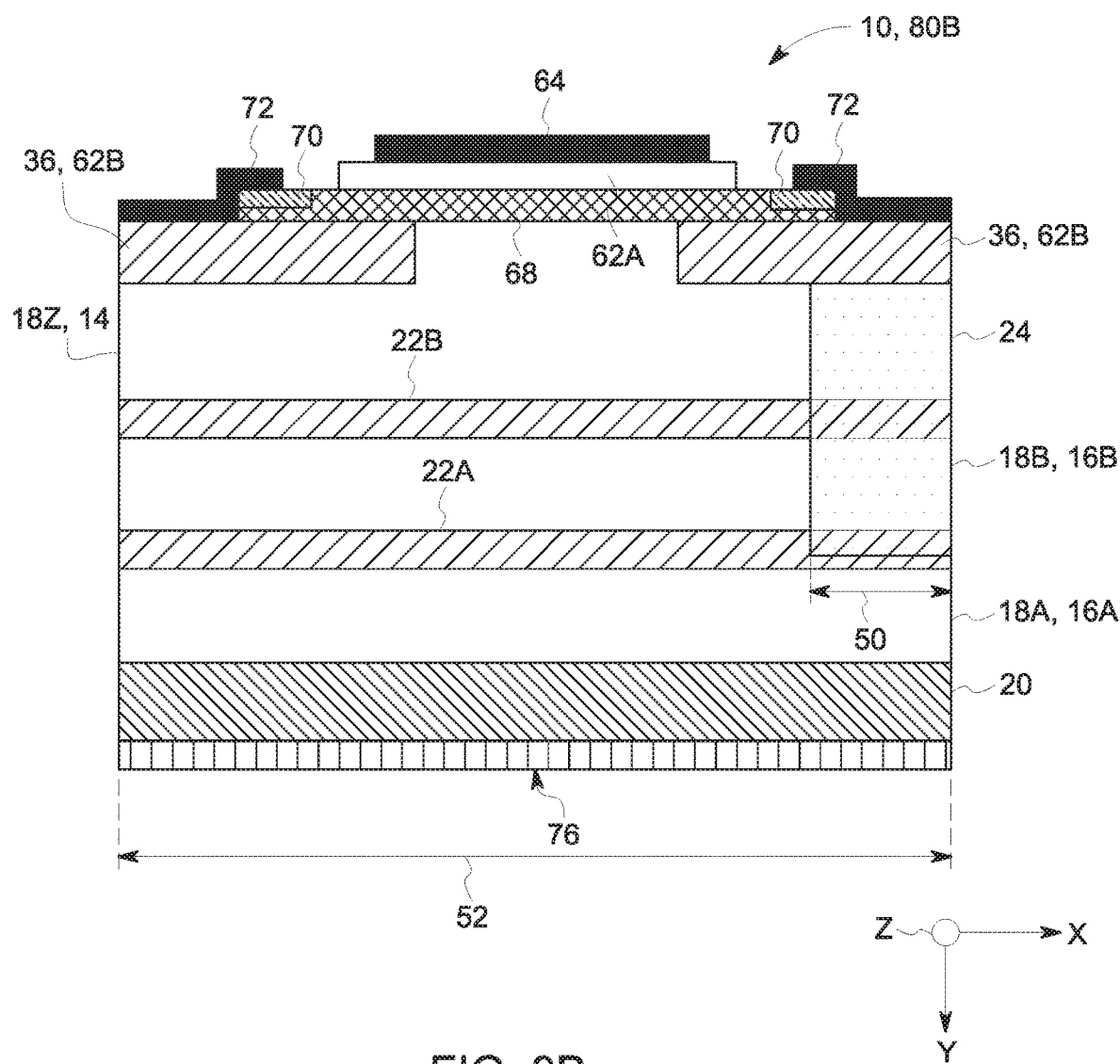
FIG. 3B is a cross-sectional view of a second embodiment of a horizontal channel JFET device that includes the CB bus, in accordance with an embodiment.
Figure 4:
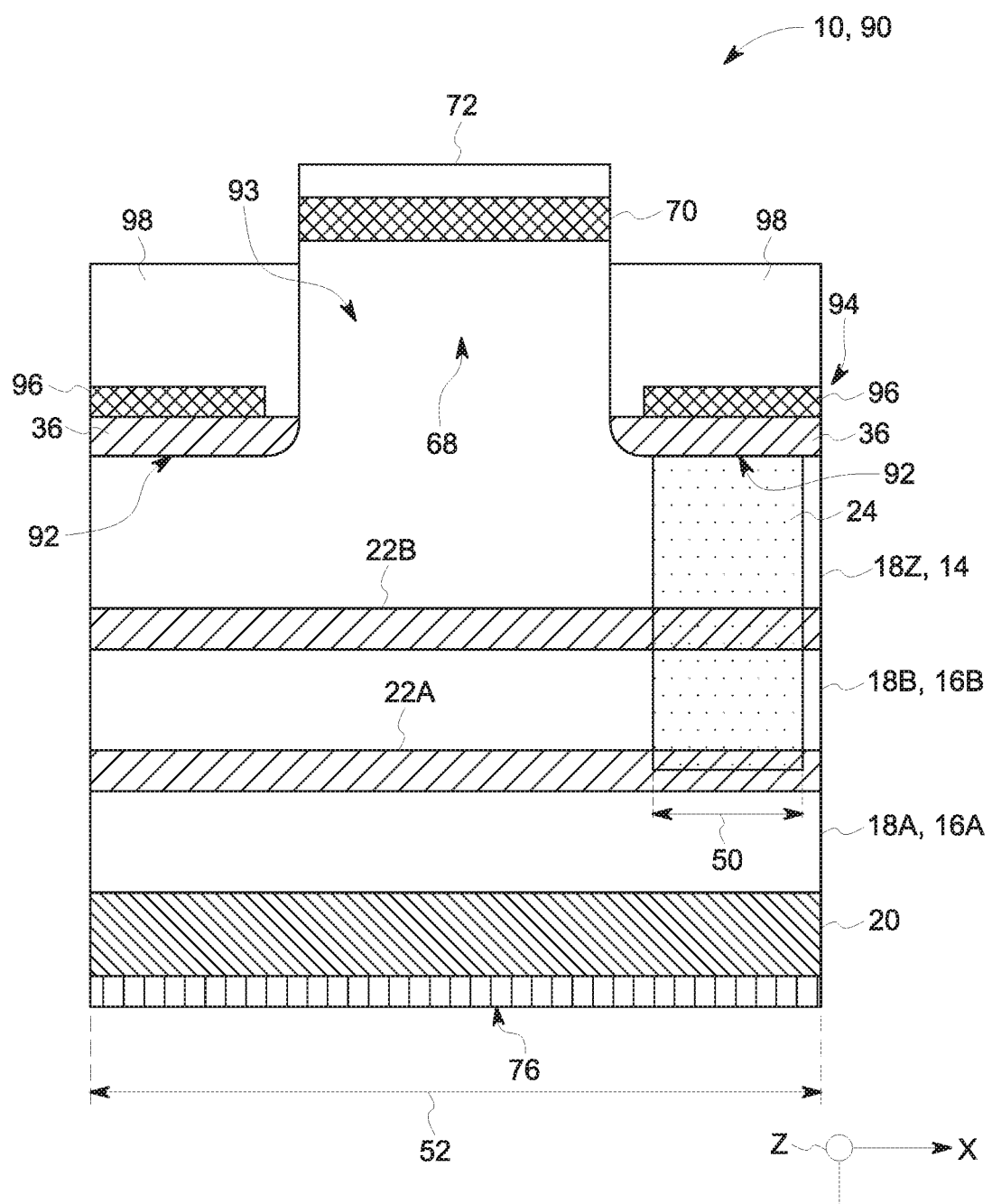
FIG. 4 is a cross-sectional view of a vertical channel metal-semiconductor field-effect transistor (MESFET) device that includes the CB bus, in accordance with an embodiment.

Further, as illustrated in each of FIGS. 2-4, which each provide a cross-sectional view perpendicular to the cross-sectional view of FIG. 1, the CB bus 24 also includes a length 50. In general, CB buses 24 that are narrower (e.g., smaller length) help enable the CB FET device 10 to achieve higher switching speeds with no significant impact on device blocking voltage. However, the length 50 may be selected to maintain charge balance within the CB layers 16, as well as to enable desirable electrical performance of the CB FET device 10 (e.g., a desired blocking voltage). As further illustrated in each of FIGS. 2-4, the CB regions 22 include a length 52. As illustrated, at least a portion of the length 50 of the CB bus 24 may be defined within or overlap with the length 52 of the CB regions 22 (e.g., along the X-axis). Moreover, the length 50 of the CB bus 24 and the length 52 of the CB regions 22 may each be defined along any suitable portion of the X-axis.

The CB bus 24 may be fabricated by introducing dopants (e.g., boron, aluminum, nitrogen, phosphorus) into the epi layers 18 of the CB FET device 10 using high energy ion implantation. A single CB bus 24 may include a single implanted region or multiple overlapping implanted regions. In some embodiments, dopants may be implanted with implant acceleration energies between approximately 500 keV and approximately 60 MeV to achieve the desired depth 40, such as 20 µm. Additionally, in certain embodiments, the CB bus 24 may formed using high energy ion implantation along with a suitable high energy masking material (e.g., silicon on insulator (SOI), polysilicon, thick silicon oxide, high-Z metals such as platinum, molybdenum, or gold). In particular, the high energy implantation mask may be placed (e.g., formed, grown, deposited) on the top surface 54 of the device epi layer 18Z after epitaxial growth. The high energy implantation mask may then mask a first portion of the top surface 54 of the device epi layer 18Z and may selectively expose a second portion of the top surface 54. Accordingly, the CB bus 24 may be implanted into the exposed second portion of the top surface 54 of the device epi layer 18Z. Further, in some embodiments, the CB bus 24 may be at least partially implanted between the epi growth steps (e.g., implanted before or after the CB regions 22 are formed in the epi layer 18A and before the epi growth of the next epi layer 18B) such that a lower energy implant may be used to achieve a suitable depth. Additionally, the CB bus 24 may be formed before or after the highly-doped region 36, in different embodiments.

By way of example, FIG. 2 is a cross-sectional view, perpendicular to the cross-sectional view of FIG. 1, of an embodiment of a CB FET device 10 that includes the CB bus 24 that electrically couples CB regions 22 of the CB layers 16 to the highly-doped region 36 of the CB FET device 10. More specifically, FIG. 2 illustrates an embodiment of a vertical channel JFET device 60. The device layer 14 of the illustrated vertical channel JFET device 60 includes a gate region 62 having the second conductivity type (e.g., a p-gate region). A gate contact 64 (e.g., gate electrode and/or gate terminal) is disposed on the gate region 62. Further, the device epi layer 18Z protrudes or extends vertically (e.g., along the Y-axis) to form an elevated mesa feature 66, which may include a channel region 68, as well as portions of the gate region 62. Additionally, as illustrated, a source region 70 is disposed above the channel region 68 within the mesa feature 66. The source region 70 has the first conductivity type (e.g., an n-gate region), such that the substrate layer 20 and the source region 70 have matching conductivity types. A source contact 72 (e.g., source electrode and/or source terminal) is disposed directly above the source region 70.

In operation, during zero gate bias, the gate region 62 and the source region 70 may have zero junction potential. That is, for example, the gate region 62 may deplete the channel region 68 within the mesa feature 66 such that the channel region 68 is not formed (e.g., opened) at this potential. More specifically, the gate region 62 may pinch off a flow of electrons from the source region 70 to the drain contact 76. However, during on-state operation, an appropriate gate voltage (e.g., at or above a threshold voltage ($V_{TH}$) of the vertical channel JFET device 60) facilitates accumulation of carriers in the channel region 68 forming a conductive path that allows current to flow from the drain contact 76 (e.g., drain electrode, drain terminal) to the source contact 72 (e.g., source electrode, source terminal).

Turning now to FIG. 3A, a cross-sectional view of a first embodiment of a horizontal channel JFET device 80A (e.g., a CB FET device 10) that includes the CB bus 24 is illustrated. The device layer 14 of the illustrated horizontal channel JFET device 80A includes a first gate region 62A having the second conductivity type (e.g., a p-gate region) disposed within the device epi layer 18Z. A gate contact 64 (e.g., gate electrode and/or gate terminal) is disposed on a portion of the first gate region 62A. Further, a channel region 68 is disposed directly above another portion of the first gate region 62A that is separate from the portion in contact with the gate contact 64. As illustrated, the channel region 68 has the first conductivity type. Further, a source region 70 is disposed directly above the channel region 68 and has the first conductivity type. Additionally, a second gate region 62B having the second conductivity type is disposed directly above the channel region 68, and the second gate region 62B is separate from the source region 70. A source contact 72 (e.g., source electrode and/or source terminal) is disposed directly above and in contact with both the source region 70 and the second gate region 62B. In some embodiments, the source contact 72 may additionally contact the channel region 68. Because the source contact 72 is disposed above the second gate region 62B, the source contact 72 may also be referred to as an additional gate contact 64.

FIG. 3B is a cross-sectional view of a second embodiment of a horizontal channel JFET device 80B (e.g., a CB FET device 10) that includes the CB bus 24. As described above with reference to the first embodiment of the horizontal channel JFET device 80A, the second embodiment of the horizontal channel JFET device 80B includes a first gate region 62A, a second gate region 62B, a channel region 68, and a source region 70 in the device layer 14. Additionally, the second embodiment of the horizontal channel JFET device 80B includes a gate contact 64 and a source contact 72. However, the layout of these features varies between the first embodiment of the horizontal channel JFET device 80A and the second embodiment of the horizontal channel JFET device 80B. To that end, the device layer 14 of the illustrated second embodiment of a horizontal channel JFET device 80B includes the channel region 68 disposed within the device epi layer 18Z. Further, the first gate region 62A having the second conductivity type (e.g., a p-gate region) is disposed directly above the channel region 68. The gate contact 64 (e.g., gate electrode and/or gate terminal) is disposed on the first gate region 62A. Further, the device layer 14 includes the second gate region 62B disposed below the channel region 68 within the device layer 14Z, while the source region 70 is disposed in an upper portion of the channel region 68. Additionally, the source contact 72 (e.g., source electrode and/or source terminal) is disposed directly above the source region 70 and the second gate region 62B. Accordingly, the source contact 72 is in direct contact with each of the second gate region 62B, the source region 70, and the channel region 68.

While the layout of the first embodiment of a horizontal channel JFET device 80A varies with the second embodiment of a horizontal channel JFET device 80B, the operation of the two devices is substantially similar. For example, at zero gate bias, the first gate region 62A and the second gate region 62B of each device (e.g., 80A and 80B) deplete the channel region 68 through the zero bias p/n junction depletion, pinching off the channel region 68. That is, for example, the channel region 68 may have zero junction potential, such that current does not flow through the channel region 68 without an applied gate bias. However, during on-state operation, suitable gate voltage at each of the first gate region 62A and the second gate region 62B may facilitate accumulation and lateral (e.g., along the X-axis) flow of carriers across in the channel region 68. Moreover, the flow of carriers in the channel region 68 forms a conductive path that allows current to flow from the drain contact 76 to the source contact 72. Further, it should be appreciated that, because the source contact 72 is in direct contact with the second gate region 62B, the first gate region 62 and the second gate region 62 may be biased differently and that the appropriate respective gate voltage may be different of the same between the first gate region 62 and the second gate region 62 to produce on-state operation conditions.

FIG. 4 is a cross-sectional view of an embodiment of a vertical channel metal-semiconductor field-effect transistor (MESFET) device 90 (e.g., a CB FET device 10) that includes the CB bus 24 that electrically couples CB regions 22 of the CB layers 16 to a portion of a blocking junction 92 (e.g., highly-doped region 36). As illustrated, the blocking junction 92 may be an interface (e.g., intersection) between the highly-doped region 36 and the device epi layer 18Z (e.g., between a region having the second conductivity type and a region having the first conductivity type). The blocking junction 92 is disposed at the bottom of a trench feature 94 within the device epi layer 18Z. An ohmic contact 96 (e.g., ohmic connection) is formed between a gate metal 98 and the highly-doped region 36. More specifically, a sidewall of the gate metal 98 and a sidewall of the channel region 68 form a Schottky contact 100 (e.g., a Schottky barrier) within a mesa feature 93 disposed between trench features 94. Further, the source region 70 is disposed directly above the channel region 68. The source contact 72 is disposed directly above the source region 70.

During operation of the illustrated device 90, with no applied gate bias, the gate region 62 and the source region 70 have zero junction potential. That is, for example, the gate region 62, and, more specifically, the Schottky contact 100, depletes the channel region 68 through zero bias p/n junction depletion, pinching off the channel region 68 and blocking or preventing flow of electrons in the channel region 68. More specifically, the Schottky contact 100 generally pinches off a flow of electrons from the source region 70 to the drain contact 76. However, during on-state operation, an appropriate gate voltage (e.g., at or above a threshold voltage ($V_{TH}$) of the vertical channel JFET device 60) facilitates accumulation of carriers in the channel region 68, forming a conductive path that allows current to flow from the drain contact 76 (e.g., drain electrode, drain terminal) to the source contact 72 (e.g., source electrode, source terminal).

Further, in each of the embodiments of the CB FET device 10 illustrated in FIGS. 2-4 (e.g., 60, 80A, 80B, and/or 90), the CB bus 24 electrically connects at least a portion of the CB regions 22 to the highly-doped region 36 (e.g., the gate region 62 and/or a portion of the blocking junction 92), which is electrically coupled to a terminal (e.g., the gate contact 64, the source contact 72, a body contact, and/or the like). To that end, the portion of the CB regions 22 are electrically coupled to a device terminal via the CB bus 24. Accordingly, during operation, the CB bus 24 generally decreases switching losses and increases maximum switching speed of the CB FET device 10. In particular, carriers from the gate region 62 and/or the portion of the blocking junction 92 may flow directly to the CB regions 22 via the CB bus 24 during transition of the CB FET device 10 from off-state (e.g., blocking state) to on-state (e.g., conducting state), and similarly, carriers from the CB regions 22 may flow directly to the gate region 62 and/or the portion of the blocking junction 92 via the CB bus 24 during transition of the CB FET device 10 from on-state to off-state. Accordingly, the conductive path may form more rapidly during the transition of the CB FET device 10 from off-state to on-state and may be more rapidly pinched off (e.g., close) during the transition of the CB FET device 10 from on-state to off-state.

Figure 5:
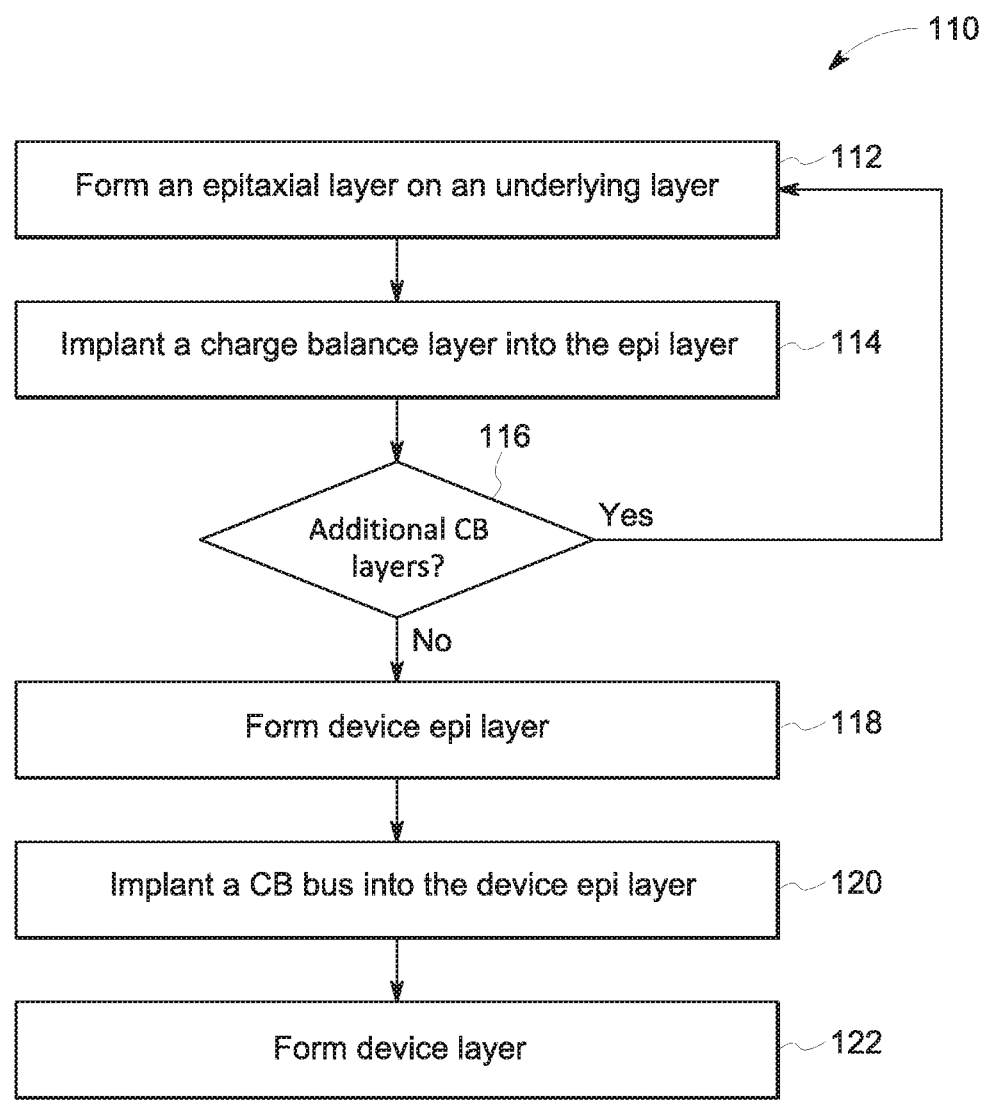
FIG. 5 is a flow chart of a process for manufacturing a CB field-effect transistor (FET) device, in accordance with an embodiment.

FIG. 5 is a flow chart of a process 110 for manufacturing an embodiment of the CB FET device 10 having the CB bus 24, such as the vertical channel JFET device 60, the horizontal channel JFET device 80 (e.g., 80A and/or 80B), and/or that vertical channel MESFET device 90, in accordance with embodiments described herein. Although the following description of the process 110 is described in a particular order, which represents a particular embodiment, it should be noted that the process 110 may be performed in any suitable order. Further, certain steps may be repeated or skipped altogether, and additional steps may be included in the process 110. The following description of the process 110 is described with reference to embodiments of the CB FET device 10 illustrated in FIGS. 1-4.

The illustrated process 110 begins with an epi layer 18 being formed (block 112) on an underlying layer. In some embodiments, the underlying layer may include the semiconductor substrate layer 18. As described above, the substrate layer 18 may be made of silicon, silicon carbide (SiC), gallium nitride, diamond, aluminum nitride, and/or boron nitride. Alternatively, the epi layer may be formed on another epi layer 18 and/or a CB layer 16, as described in greater detail below.

To form the first epi layer 18A on the underlying layer, the epi layer 18A may be grown using chemical vapor deposition (CVD). However, in some embodiments, the epi layer 18A may be grown onto the underlying layer using any suitable technique. The epi layer 18A may be formed from one or more wide-bandgap semiconductor materials, such as silicon carbide, gallium nitride, diamond, aluminum nitride, and/or boron nitride. Further, as discussed above, the epi layer 18A may have a first conductivity type (e.g., n-type) and a low dopant concentration relative to other regions of the CB FET device 10 (e.g., the CB regions 22, the gate region 62, the source region 70, and/or the like).

After the epi layer 18 is formed on the underlying layer, the illustrated process 110 proceeds with a CB layer 16A being implanted (block 114) into the epi layer 18A. More specifically, a set of CB regions 22A oppositely-doped relative to the epi layer 18A are implanted into the epi layer 18A to form the first CB layer 16A. Each of the set of CB regions 22A may have a doping concentration less than or equal to $1 \times 10^{18}$ cm$^{-3}$ and/or greater than or equal to $2 \times 10^{16}$ cm$^{-3}$, as described above. More specifically, in some embodiments, because the each of the set of CB regions 22A may be implanted with a variable distribution of dopant concentrations, the CB regions 22 may be described as having an integrated charge (e.g., dose) of approximately (e.g., +/−20% and/or +/−50%) $2 \times 10^{13}$ cm$^{-2}$. The integrated charge may be determined and/or adjusted based in part on the depth at which the set of CB regions 22A are implanted and/or the implant acceleration energy used to implant the set of CB regions 22A. Further, the set of CB regions 22A may be implanted according to any suitable means (e.g., high energy implant, lower energy implant). For example, in some embodiments, prior to implanting the set of CB regions 22A, a mask may be formed on at least a portion of the epi layer 18A. The mask may be formed from silicon oxide, silicon nitride, polycrystalline silicon, silicon, a metal layer, a resist layer, or a suitable combination thereof. Moreover, the mask may be formed using any suitable means. That is, for example, the mask may be deposited, grown, and/or coated directly onto the portion of the epi layer 18A. Furthermore, once the mask material has been deposited on the surface of the epi layer 18A, the mask may be formed by patterning (e.g., lithographically patterning) the mask material to expose or uncover a portion of the epi layer 18A. The set of CB regions 22A may then be selectively implanted through the exposed portion of the epi layer 18A, and the mask may then be removed.

In some embodiments, the set of CB regions 22A may be implanted with standard low energy implantation techniques. For example, the set of CB regions 22A may be implanted to a depth less than or equal to 1 µm. Accordingly, an implantation energy less than 500 keV may be used to implant each of the CB regions 22A However, in some embodiments, the set of CB regions 22A may be implanted according to a suitable high energy ion implantation technique. Accordingly, each of the CB regions 22A may be implanted to a depth greater than approximately 5 µm and/or less than approximately 15 µm within the epi layer 18A. Moreover, an implantation energy greater than 500 keV and/or less than 50 MeV may be used to implant each of the CB regions 22A. Accordingly, the mask described above may be a high energy implantation mask (e.g., silicon on insulator (SOI), polysilicon, thick silicon oxide, high-Z metals such as platinum, molybdenum, gold) used in conjunction with the high energy ion implantation.

After implanting the CB layer 16A into the epi layer 18A, to construct the CB FET device 10 with additional CB layers 16 (e.g., 16B) (decision block 116), a first portion (e.g., block 112 and block 114) of the illustrated process 110 may be repeated any suitable number of times. For example, the illustrated embodiments of the CB FET device 10 of FIGS. 1-4 include two CB layers 16 (e.g., 16A and 16B). Accordingly, in such embodiments, an additional epi layer 18B may be formed (block 112) on the implanted CB layer 16A, and an additional CB layer 16B may be implanted (block 114) into the additional epi layer 18B.

After determining each of the CB layers 16 to be included in the CB FET device 10 have been formed (decision block 116), the process 110 may proceed with a device epi layer 18Z being formed (block 118) on the top CB layer 16B (e.g., the last implanted CB layer 16B). As described above with reference to block 112, the device epi layer 18Z may be formed according to any suitable techniques (e.g., CVD). The device epi layer 18Z may be formed from one or more wide-bandgap semiconductor materials, such as silicon carbide, gallium nitride, diamond, aluminum nitride, and/or boron nitride. Further, as discussed above, the device epi layer 18Z may have a first conductivity type and a certain low dopant concentration relative to other regions of the CB FET device 10 (e.g., the CB regions 22, the gate region 62, the source region 70, and/or the like). In some embodiments, the device epi layer 18Z may have the same dopant concentration as the one or more epi layers 18 (e.g. 18A and/or 18B) formed previously (e.g., at block 112).

For the illustrated embodiment of the process 110, a CB bus 24 may then be implanted (block 120) into the device epi layers 18. The CB bus 24 may be implanted using high energy implantation techniques. That is, for example, the CB bus 24 may be implanted with implant acceleration energies between approximately 500 keV and approximately 60 MeV to achieve a desired depth 40. Accordingly, in some embodiments, to implant the CB bus 24, a high energy implantation mask may be used (e.g., silicon on insulator (SOI), polysilicon, thick silicon oxide, high-Z metals such as platinum, molybdenum, gold), as described.

In some embodiments, the CB bus 24 may be implanted such that it connects to and electrically couples with one or more CB regions 22. Accordingly, the CB bus 24 may be implanted to extend through at least the entire thickness of the device epi layer 18Z, such that the CB bus 24 electrically couples at least a portion of the CB regions 22 to the highly-doped region 36 of the device layer 14. For example, in some embodiments the CB bus 24 may be implanted to a depth 40, such that the CB bus 24 extends through at least a portion of the thicknesses 30 of each of the CB layers 16 (e.g., 16A and 16B). It should be noted that the CB bus 24 may alternatively be implanted to a depth such that the CB bus 24 extends through at least a portion of the thickness of a subset of the CB layers 16. That is, for example, the CB bus 24 may not extend through or contact each of the implanted CB layers 16. Further, as described above, depending on the width 42 of the CB bus 24, the CB bus 24 may or may not contact each of the CB regions 22 (e.g., 22A and/or 22B) within a respective CB layer 16 (e.g., 16A and/or 16B, respectively) contacted by the CB bus 24.

After implanting (block 120) the CB bus 24, the illustrated embodiment of the process 110 proceeds with a remaining portion of the device layer 14 being formed (block 122). As described above, in addition to the device epi layer 18Z, the device layer 14 includes a highly-doped region 36, such as the gate region 62 of FIGS. 2 and 3 and/or the portion of the blocking junction 92 of FIG. 4, a source region 70 of FIGS. 2-4, a gate region 62 of FIGS. 2 and 3, and/or any other suitable features of the CB FET device 10. In some embodiments, the highly-doped region 36 may have the second conductivity type (e.g., p-type) and a relatively high dopant concentration compared to the device epi layer 18Z. Further, the highly-doped region 36 may be formed in the device layer 14 using any suitable technique. Accordingly, the highly-doped region 36 may be implanted into the device epi layer 18Z using high energy ion implantation techniques and/or any suitable implantation techniques.

Moreover, the highly-doped region 36 of the device layer 14 contacts and electrically couples to the CB bus 24. Accordingly, in embodiments where the highly-doped region 36 is implanted, the highly-doped region 36 may be implanted to contact at least a portion of the CB bus 24. Further, in some embodiments, the highly-doped region 36 may be implanted into the device epi layer 18Z before the CB bus 24 is implanted (block 120). Accordingly, the CB bus 24 may be implanted to contact the highly-doped region 36, in addition to contacting at least a portion of a CB region 22. In some embodiments, other processing steps may be subsequently performed to form other features (e.g., gate region 62, gate contact 64, source region, source contact 72, drain contact 76) of the CB FET device 10 to form a functional device, in accordance with the present disclosure.

Figure 6:
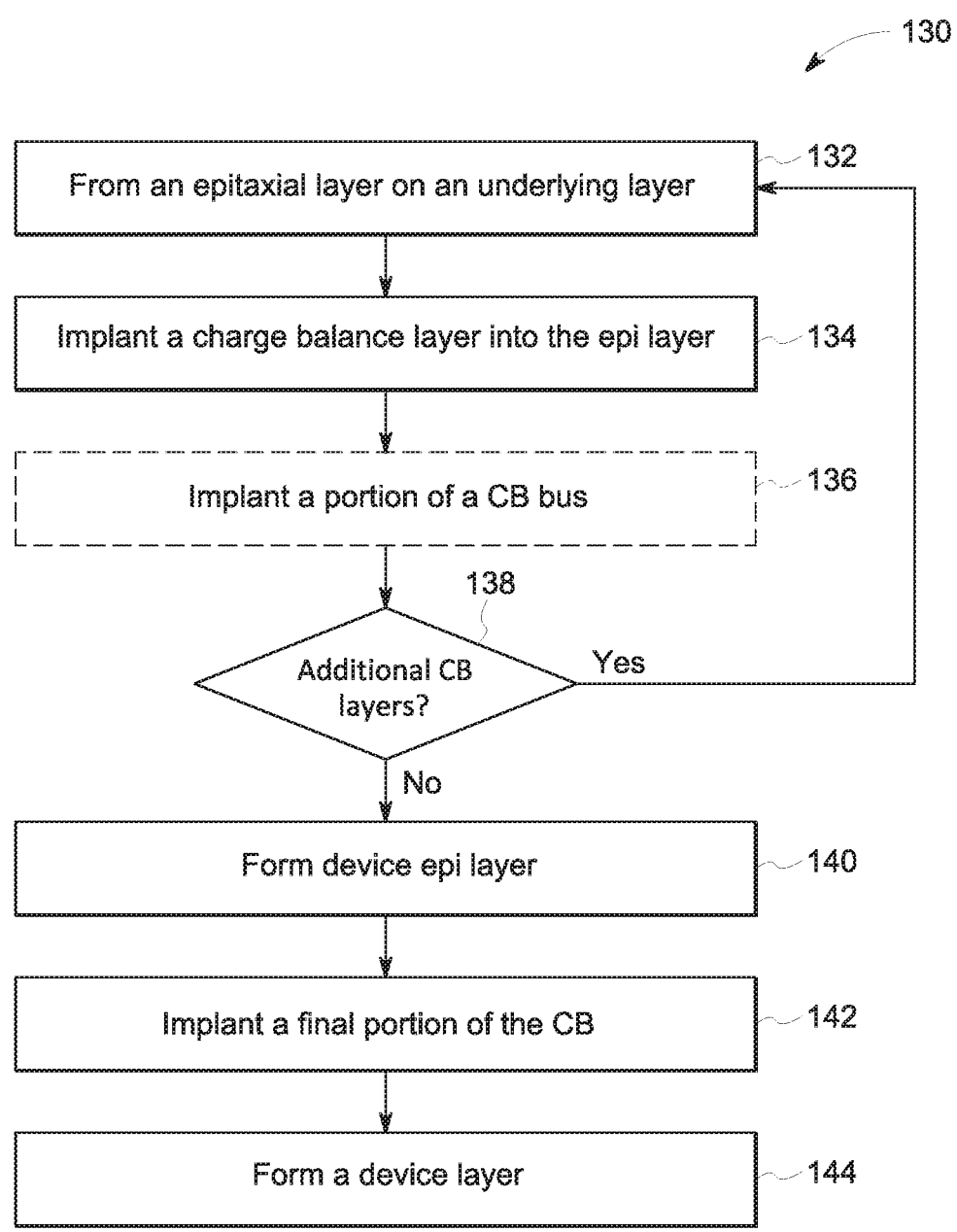
FIG. 6 is a flow chart of another process for manufacturing a CB FET device, in accordance with an embodiment.

While the process 110 is described as implanting the CB bus 24 in a single step, the CB bus 24 may alternatively be implanted in a series of steps. That is, for example, as illustrated by the flow chart of an process 130 for manufacturing an embodiment of a CB FET device 10 in FIG. 6, two or more portions of the CB bus 24 may be respectively implanted during different steps involved in fabricating a CB FET device 10. Although the following description of the process 130 is described in a particular order, which represents a particular embodiment, it should be noted that the process 130 may be performed in any suitable order. Further, certain steps may be repeated or skipped altogether, and additional steps may be included in the process 130.

For the illustrated embodiment of the process 130 begins with an epi layer 18A being formed (block 132) on an underlying layer and a CB layer 16A being implanted (block 134) into the epi layer 18A, which are described above with reference to process 110 (e.g., block 112 and block 122, respectively). A first portion of a CB bus 24 may then be implanted (block 136) into at least a portion of the thickness 30A of at least one of the set of CB regions 22 of the implanted CB layer 16A. In some embodiments, the first portion of the CB bus 24 may be implanted according to high energy implantation techniques. Accordingly, implant acceleration energies between approximately 500 keV and approximately 60 MeV may be employed. Further, a high energy implantation mask may be used (e.g., silicon on insulator (SOI), polysilicon, thick silicon oxide, high-Z metals such as platinum, molybdenum, gold), as described above with reference to block 120 of process 110. However, because only a portion of the CB bus 24 is implanted, in some embodiments, the CB bus 24 may be implanted at a shallower depth (e.g., with a lower implantation acceleration energy) than the CB bus 24 implanted in a single step according to the illustrated process 110 of FIG. 5.

To form a suitable number of CB layers 16, a portion (e.g., block 132, block 134, and block 136) of the process 130 may be repeated one or more times. Accordingly, after determining (decision block 138) an additional CB layer 16B will be added, a second epi layer 18B may be formed (block 132) on the previously implanted CB layer 16A and a second CB layer 16B may be implanted (block 134). Further, as illustrated, a second portion of the CB bus 24 may be implanted (block 136). More specifically, in some embodiments, the second portion of the CB bus 24 may be implanted such that the CB bus 24 extends through at least one of the set of CB regions 22B of the second CB layer 16B and the thickness 28B of the second epi layer 18B. Moreover, the second portion of the CB bus 24 may be implanted such that it contacts and/or extends through at least a portion of the previously implanted first portion of the CB bus 24. Accordingly, a total thickness of the CB bus 24 may be less than or equal to a sum of the thicknesses of each of the portions of the CB bus 24.

In some embodiments, subsequent portions (e.g., the second portion, a third portion, and/or the like) of the CB bus 24 may be implanted to a greater depth than the first portion of the CB bus 24 in order to extend through the entire thickness 28B of the second epi layer 18B, as well as a portion of the thickness of the first portion of the CB bus 24. Accordingly, the implantation acceleration energy used to implant the second portion of the CB bus 24 may be greater than the implantation energy used to implant the portion of the CB bus 24. Further, the thickness of the second portion of the CB bus 24 may be greater than the thickness of the first portion of the CB bus 24. However, in other embodiments, the thickness of the second portion CB bus 24 may be the same or less than the thickness of the first portion of the CB bus 24.

As illustrated by the process 130, after determining (decision block 138) no additional CB layers 16 are to be added during fabrication of a CB FET device 10, a device epi layer 18Z is formed (block 140). As described above with reference to process 110, the device epi layer 18Z may be formed according to any suitable techniques, such as with CVD. Moreover, the device epi layer 18Z may be formed from one or more wide-bandgap semiconductor materials, such as silicon carbide, gallium nitride, diamond, aluminum nitride, and/or boron nitride.

After the device epi layer 18Z is formed, the process 130 may proceed with a final portion of the CB bus 24 being implanted (block 142). The final portion of the CB bus 24 may be implanted such that the final portion of the CB bus 24 extends through at least a portion of the thickness of the device epi layer 18Z and a portion of the thickness of the top CB layer 16B, such that it contacts at least a portion of the previously implanted portions (e.g., the second portion) of the CB bus 24. Accordingly, a total thickness of the CB bus 24 may be less than or equal to a sum of the thicknesses of each of the previously implanted portions (e.g., the first portion and the second portion) of the CB bus 24, as well as a thickness of the final portion of the CB bus 24.

In some embodiments, the device layer 14 (e.g., a remaining portion of the device layer 14) may then be formed (block 144). As described above, forming the device layer 14 involves forming the highly-doped region 36, such that it is electrically coupled to the CB bus 24. Accordingly, the highly-doped region 36 may be implanted to contact at least a portion of the CB bus 24 (e.g., the final portion). Subsequently, other processing steps may be performed to form other features (e.g., gate region 62, gate contact 64, source region, source contact 72, drain contact 76) of the CB FET device 10 to form a functional device, in accordance with the present disclosure.

It should be noted that, in some embodiments, implanting (block 136) the portion of the CB bus 24 may be selectively performed during the formation of the CB layers 16. More specifically, in some embodiments, any suitable number of CB layers 16 may be formed (e.g., block 132 and block 134 may be repeated a suitable number of times) before the first portion of the CB bus 24 is implanted. In such embodiments, the CB bus 24 may not extend through the entire thickness of each of the formed CB layers 16. That is, for example, the CB bus 24 may extend through at least a portion of the thickness of a top CB layer 16B and may not contact a bottom CB layer 16A. Following the implantation of the first portion of the CB bus 24 into any suitable one or more CB layers 16, however, a respective additional portion of the CB bus 24 may be implanted after each subsequent CB layer 16 (e.g., 16B) is formed, such that a contiguous, vertical CB bus 24 is generated or fabricated. Alternatively, in some embodiments, the respective additional portions of the CB bus 24 may be implanted after a set of CB layers 16 are subsequently formed. That is, for example, the thickness of each implanted portion of the CB bus 24 may be adjusted such that portions of the CB bus 24 may be implanted with reduced or increased frequency.

Technical effects of the invention include designs and methods of manufacturing CB FET devices that reduce the resistance and increase switching speed of the CB FET devices while maintaining the high blocking voltage of the CB FET devices. In particular, the disclosed CB FET devices include a CB bus that electrically couples one or more CB regions of a CB FET device to a highly-doped region having the same conductivity type as the one or more CB regions, such as a gate region or a portion of a blocking junction. The CB bus may be implanted using high energy ion implantation. Accordingly, the resulting CB FET device may have increased switching speeds and reduced switching losses while maintaining high blocking voltages.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A charge balance (CB) vertical channel junction field-effect transistor (JFET) device, comprising:
   a first CB layer defined in a first epitaxial (epi) layer having a first conductivity type, wherein the first CB layer includes a first plurality of CB regions having a second conductivity type, and wherein each of the first plurality of CB regions has a respective depth that is less than a thickness of the first epi layer;
   a second CB layer defined in a second epi layer having the first conductivity type that is disposed directly on the first CB layer, wherein the second CB layer includes a second plurality of CB regions having a second conductivity type, and wherein each of the second plurality of CB regions has a respective depth that is less than a thickness of the second epi layer;
   a device layer defined in a device epi layer disposed directly on the second CB layer, wherein the device layer includes a highly-doped gate region having the second conductivity type, wherein the device epi layer has the first conductivity type; and
   a CB bus region having the second conductivity type disposed in the device layer, the first CB layer, and the second CB layer, wherein the CB bus region extends between and electrically couples a first CB region of the first plurality of CB regions of the first CB layer, a second CB region of the second plurality of CB regions of the second CB layer, and the highly-doped gate region of the device layer.

2. The CB vertical channel JFET device of claim 1, comprising a gate terminal disposed on the highly-doped gate region, wherein the CB bus region electrically couples the CB region of the plurality of CB regions to the gate terminal.

3. The CB vertical channel JFET device of claim 1, comprising a substrate layer, wherein the substrate layer comprises silicon carbide (SiC).

4. The CB vertical channel JFET device of claim 1, wherein the highly-doped gate region is disposed at a portion of an upper surface of the device epi layer.

5. The CB vertical channel JFET device of claim 1, wherein the device layer extends vertically, away from the CB layer, to form an elevated mesa.

6. The CB vertical channel JFET device of claim 5, comprising a source region having the first conductivity type, wherein the source region is disposed within the elevated mesa.

7. The CB vertical channel JFET device of claim 6, comprising a channel region having the first conductivity type, wherein the channel region is disposed within the elevated mesa below the source region.

8. The CB vertical channel JFET device of claim 6, comprising a source contact disposed directly above the source region on the elevated mesa.

9. The CB vertical channel JFET device of claim 5, wherein the highly doped gate region comprises a vertical portion that extends along a sidewall of the elevated mesa and a horizontal portion disposed adjacent to the elevated mesa.

10. The CB vertical channel JFET device of claim 9, comprising a gate contact disposed directly above the horizontal portion of the highly doped gate region.

11. The CB vertical channel JFET device of claim 10, wherein the CB bus region extends between the horizontal portion of the highly doped gate region and the CB region of the CB layer to electrically couple the gate contact to the CB region of the CB layer.

12. The CB vertical JFET device of claim 1, wherein the CB bus region extends entirely through the thickness of the second epi layer.

13. The CB vertical JFET device of claim 12, wherein the CB bus region does not extend entirely through the thickness of the first epi layer.

14. The CB vertical JFET device of claim 5, wherein the first plurality of CB regions and the second plurality of CB regions laterally extend in a first direction, the elevated mesa laterally extends in a second direction that is orthogonal to the first direction.

15. The CB vertical JFET device of claim 1, wherein the first CB layer and the second CB layer are epitaxial doped with the first conductivity type, and wherein the first plurality of CB regions and the second plurality of CB regions of the second conductivity type charge balance the epitaxial doping of the first CB layer and the second CB layer, respectively.

16. The CB vertical JFET device of claim 1, wherein the first plurality of CB regions and the second plurality of CB regions each comprise a depth between 0.5 µm and 1.0 µm and a width between 0.1 µm and 2 µm.

17. A charge balance (CB) vertical channel junction field-effect transistor (JFET) device, comprising:
 a first CB layer defined in a first epitaxial (epi) layer having a first conductivity type and disposed on a wide-bandgap substrate layer having the first conductivity type, wherein the first CB layer includes a first plurality of CB regions having a second conductivity type, and wherein each of the first plurality of CB regions has a respective depth that is less than a thickness of the first epi layer;
 a second CB layer defined in a second epi layer having the first conductivity type that is disposed directly on the first CB layer, wherein the second CB layer includes a second plurality of CB regions having a second conductivity type, and wherein each of the second plurality of CB regions has a respective depth that is less than a thickness of the second epi layer;
 a device layer defined in a device epi layer disposed on the CB layer, wherein the device epi layer has the first conductivity type, wherein the device layer includes:
  a highly-doped gate region having the second conductivity type disposed at an upper surface of the device epi layer, wherein a first contact is disposed directly on the highly-doped gate region; and
  a source region having the first conductivity type disposed at the upper surface of the device epi layer and proximate to the highly-doped gate region, wherein a source contact is disposed directly on at least a portion of the source region; and
 a CB bus region having the second conductivity type disposed in the device layer, the first CB layer, and the second CB layer, wherein the CB bus region extends between and electrically couples a first CB region of the first plurality of CB regions of the first CB layer, a second CB region of the second plurality of CB regions of the second CB layer, and the highly-doped gate region of the device layer.

18. The CB vertical channel JFET device of claim 17, wherein the plurality of CB regions comprise an integrated charge approximately equal to $2 \times 10^{13}$ per centimeters squared ($cm^{-2}$).

19. The CB vertical channel JFET device of claim 17, wherein the device layer extends vertically, away from the CB layer, to form an elevated mesa, wherein the source region is disposed within the elevated mesa and the source contact is disposed directly above the source region on the elevated mesa.

20. The CB vertical channel JFET device of claim 19, wherein the highly doped gate region comprises a vertical portion that extends along a sidewall of the elevated mesa and a horizontal portion disposed adjacent to the elevated mesa.

21. The CB vertical channel JFET device of claim 20, comprising a gate contact disposed directly above the horizontal portion of the highly doped gate region.

22. The CB vertical channel JFET device of claim 20, wherein the CB bus region extends between the horizontal portion of the highly doped gate region and the CB layer to electrically couple the gate contact to the CB region of the CB layer.

\* \* \* \* \*